United States Patent
Stivers et al.

(10) Patent No.: US 6,627,362 B2
(45) Date of Patent: Sep. 30, 2003

(54) PHOTOLITHOGRAPHIC MASK FABRICATION

(75) Inventors: Alan R. Stivers, Palo Alto, CA (US); Shoudeng Liang, Sunnyvale, CA (US); Barry Lieberman, Los Altos, CA (US)

(73) Assignee: Intel Corporation, Santa Clara, CA (US)

(*) Notice: Subject to any disclaimer, the term of this patent is extended or adjusted under 35 U.S.C. 154(b) by 172 days.

(21) Appl. No.: 09/984,631

(22) Filed: Oct. 30, 2001

(65) Prior Publication Data

US 2003/0082460 A1 May 1, 2003

(51) Int. Cl.[7] .............................................. G03F 9/00
(52) U.S. Cl. ........................................................ 430/5
(58) Field of Search ............................. 430/30, 5, 322, 430/323, 324; 378/34, 35

(56) References Cited

U.S. PATENT DOCUMENTS

| 5,935,737 A | 8/1999 | Yan ................................. 430/5 |
| 6,235,434 B1 | 5/2001 | Sweeney et al. ............... 430/5 |

OTHER PUBLICATIONS

Scongtac Jeong et al.; Actinic detection of EUVL mask blank defects; Sep. 1998; Part of the BACUS Symposium on Photomask Technology and Management, SPIE vol. 3546, pp. 524–530.

*Primary Examiner*—S. Rosasco
(74) *Attorney, Agent, or Firm*—Fish & Richardson P.C.

(57) ABSTRACT

A method of making a photolithographic mask includes detecting a defect in a mask blank. The mask blank includes a reflector on a substrate. The method also includes calculating a correction of an absorber pattern to be used in forming an absorber and forming an absorber on the mask blank using the absorber pattern and the calculated absorber pattern correction. The correction reduces effects of the mask blank defect on the operation of the mask.

29 Claims, 9 Drawing Sheets

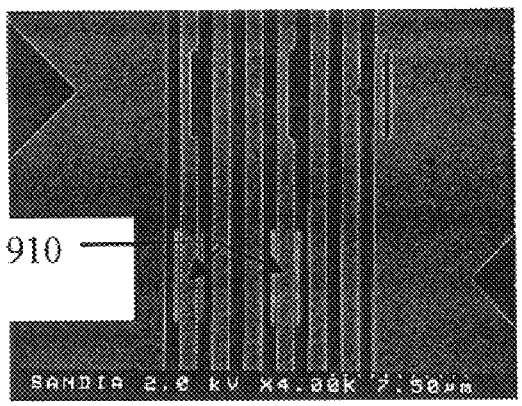 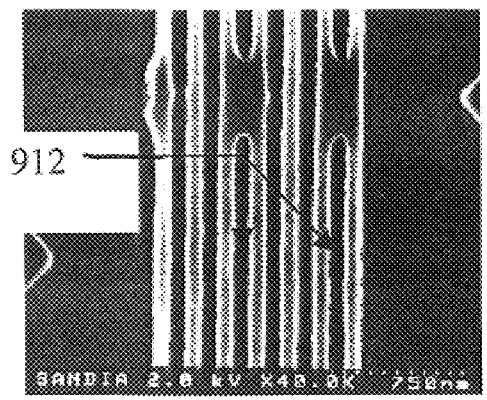
Fig. 9C
Fig. 9D

PHOTOLITHOGRAPHIC MASK FABRICATION

TECHNICAL FIELD

This invention relates to fabrication of photolithographic masks for semiconductor processing.

BACKGROUND

Photolithography uses an imaging system that directs radiation onto a patterned mask to form an image that then is projected onto a semiconductor wafer covered with light-sensitive photoresist.

DESCRIPTION OF DRAWINGS

FIGS. 9A–9D show images of portions of a mask formed in controlled conditions to show effects of the procedure of FIGS. 6 and 7.

Like reference symbols in the various drawings indicate like elements.

DETAILED DESCRIPTION

Photolithography uses an imaging system that directs radiation onto a mask to form a pattern and then projects the image of that pattern with a reduction, for example, of 4:1, onto a semiconductor wafer covered with light-sensitive photoresist. The pattern is formed from absorptive features or lines etched into the mask, as discussed below. The radiation used in photolithography may be at any suitable wavelength, with the resolution of the system increasing with decreasing wavelength. The ability to print smaller features onto the semiconductor wafer improves as the resolution increases.

One type of photolithography system uses radiation in the extreme ultraviolet (EUV) wavelength range. In general, EUV radiation has wavelengths in the range of 1 to 40 nanometers (nm), and the EUV radiation used in photolithography has wavelengths in the range of 10 to 15 nm. Photolithography carried out with radiation in this region has come to be known as EUV lithography (EUVL).

Figure 1:
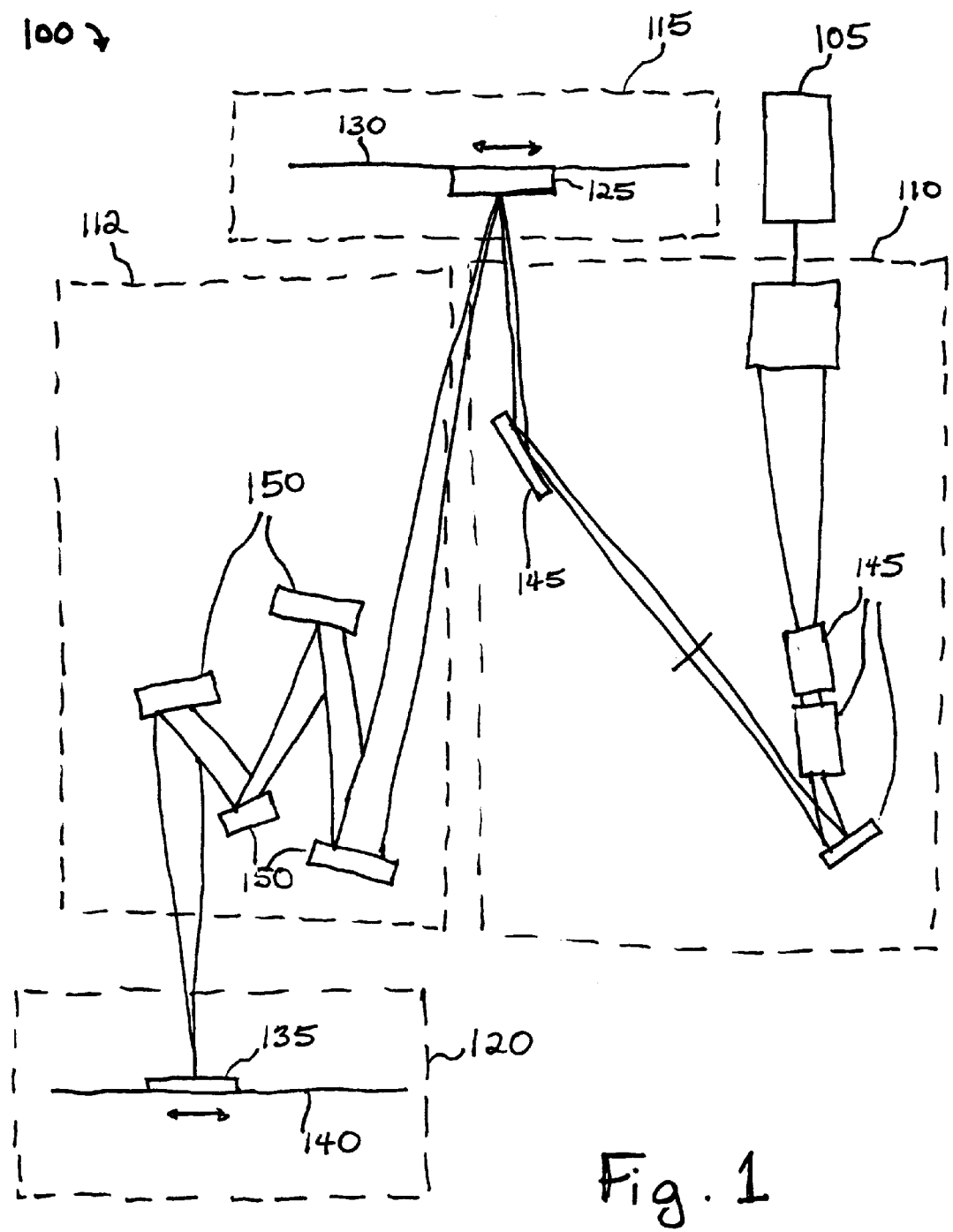
FIG. 1 is a block diagram of a photolithography imaging system that uses a mask in processing a wafer.

Referring to FIG. 1, an EUVL imaging system 100 includes a radiation source 105, a condenser optics section 110, a projection optics section 112, a mask stage 115, and a wafer stage 120. For ease of discussion, the implementations that are discussed relate to EUVL imaging systems. However, the methods and systems described are not limited to EUVL imaging systems. Rather, they may be used in any photolithography imaging system that uses a mask, and in some instances, a reflective mask. They also may be used in a photolithography imaging system that uses a transmissive mask.

The radiation source 105 may be any source able to produce radiation in the extreme ultraviolet (EUV) wavelength range. One example of a suitable radiation source 105 is a plasma created when a laser, such as a 1700 Watt (W) pulsed ytterbium-aluminum-garnet (YAG) solid-state laser, illuminates a gas, such as a supersonic jet of xenon gas. As another example, a suitable radiation source 105 may be formed using bending magnets and undulators associated with synchrotrons. As a further example, a suitable radiation source 105 may be formed or developed from discharge sources, which have the potential to provide adequate power in the desired wavelength range. EUV radiation is strongly absorbed in virtually all transmissive materials, including gases and glass. For this reason, EUV imaging is carried out in a near vacuum.

The mask stage 115 includes a mask 125 mounted to a transport stage 130 that scans the mask 125. The mask 125 may be planar, concave, convex, or any suitable shape to permit patterning. In an EUVL imaging system, the mask 125 is reflective because EUV radiation is strongly absorbed in transmissive materials such as lenses, which may be used in traditional photolithography imaging systems.

The wafer stage 120 includes a semiconductor wafer 135 mounted to a transport stage 140 that scans the wafer 135 in synchrony with the mask 125 and steps the wafer 135 into a position to accept a next image from the mask 125.

The condenser optics section 110 brings the radiation from the source 105 to the mask stage 115. In an EUVL imaging system, the condenser optics are reflective because of the absorption associated with EUV radiation. Accordingly, the condenser optics section 110 includes condenser reflectors or mirrors 145 that collect and focus the radiation from the source 105 onto the mask stage 115. Any number of condenser mirrors 145 may be used, such as, for example, the four shown in FIG. 1.

The projection optics section 112 reduces the image from the mask 125 in the mask stage 115 and forms the image onto wafer 135 in the wafer stage 120. In an EUVL imaging system, the projection optics are reflective because of the absorption associated with EUV radiation. Accordingly, the projection optics section 112 includes reflectors or mirrors 150 that project radiation reflected from the mask 125 onto the wafer. The reflectance spectrum of the mask 125 may be matched to that of the mirrors in the projection optics section 112.

Referring also to FIGS. 2A–2E, a reflective mask 225 (FIG. 2E) is fabricated from an absorber layer 230 that absorbs EUV radiation, a buffer layer 235, a multilayer (ML) reflector 240, and an underlying substrate 241. The substrate 241 may be any substrate that can handle subsequent fabrication processes and is typically made of a material having a low thermal expansion, such as, for example, ULE™, an ultralow expansion titanium silicate glass made by Corning Corporation of New York. In one implementation, the substrate 241 is 0.64 cm thick. In operation, any radiation incident on the mask 225 (represented by arrow 250 in FIG. 2E) will be absorbed by a patterned absorber layer or partially reflected (represented by arrow 255 in FIG. 2E) by the ML reflector 240 in a non-patterned region.

Figure 2A:
FIGS. 2A–2E are cross-sectional representations of a mask being fabricated using a first fabrication process.
Figure 2B:
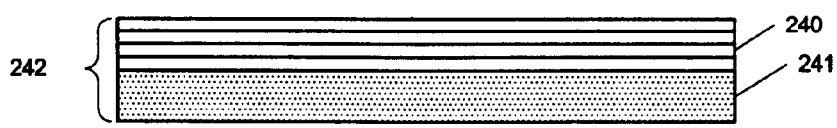

As shown in FIG. 2B, the ML reflector layer 240 is deposited on the substrate 241 to form what may be referred to as a mask blank 242. The material used for the ML reflector layer 240 generally consists of multiple layers of material with alternating index of refraction that provide a resonant reflectivity when the period of the layers is approximately one half the wavelength of the radiation used in the imaging system. A number of different combinations of reflective and transmissive materials may be used. In one implementation, the materials are molybdenum (Mo) and silicon (Si), which are alternately layered at thicknesses of about 2 to 12 nm to create a ML reflector thickness of about 50 to 500 nm.

The buffer layer 235 may be made of any material that serves as a stop layer or an etch profile controller. The buffer layer 235 protects the underlying ML reflector 240 during mask etching and repair while ensuring that etched patterns in the absorber layer are clean and substantially vertical. The buffer layer 235 is relatively non-opaque and should be easy to selectively remove or etch. The thickness of the buffer layer 235 is mostly determined by absorber etch selectivity to the buffer material, repair etch selectivity to the ML reflector, and optical inspection contrast. In one implementation, the buffer layer 235 has a thickness ranging from 30 to 50 nm and is made of silicon dioxide ($SiO_2$). In other implementations, the buffer layer may be made of carbon (C) or ruthenium (Ru).

The absorber layer 230 may be made of any suitable material that is absorptive of radiation at the wavelength used in the imaging system 100 and that can be selectively etched. The thickness of the absorber layer 230 is mostly determined by the radiation absorption of the material used as the absorber. The absorber layer 230 may be made of any material or composition that meets these criteria, such as, for example, chromium (Cr), tantalum (Ta), tantalum nitride (TaN), and tantalum boron nitride (TaBN). Typically, if TaN is used, the thickness of the absorber layer 230 may be in the range of 50 to 100 nm.

Figure 2C:
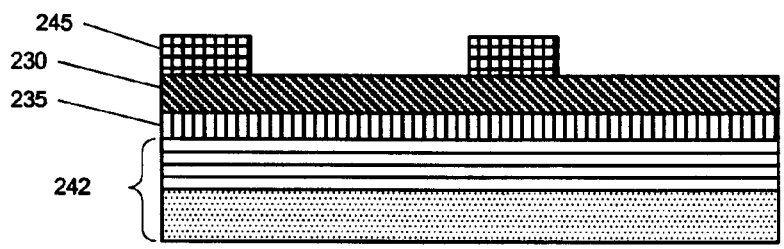

Initially, the substrate 241 is fabricated to form the mask 225 (FIG. 2A). The ML reflector 240 is deposited on the substrate 241, thus forming the mask blank 242 (FIG. 2B). Next, the buffer layer 235 is placed on top of the ML reflector 240 using any suitable technique such as physical vapor deposition or sputtering (FIG. 2C). The technique is performed at a temperature selected to avoid modification to the underlying ML reflector 240. Next, the absorber layer 230 is placed on top of the buffer layer 235 using any suitable technique such as physical vapor deposition or sputtering (FIG. 2C).

Figure 2D:
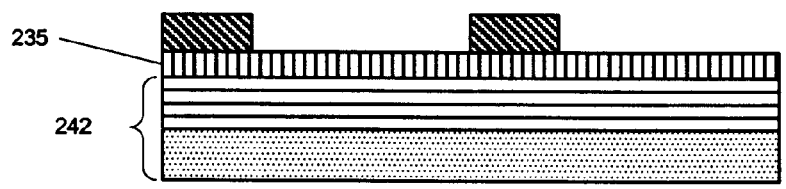
Figure 2E:
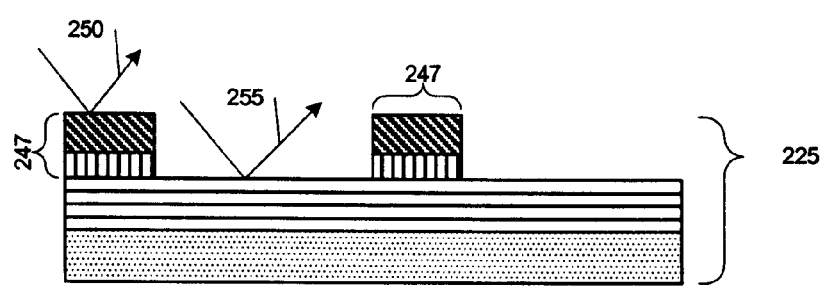

Referring to FIGS. 2C–2E, generally, a photoresist 245 is patterned on top of the absorber layer 230 using stored pattern data (FIG. 2C). That pattern is then replicated into the absorber layer 230 by etching the absorber layer 230 in locations not covered by the photoresist 245 to form an etched absorber pattern (FIG. 2D). The photoresist 245 then is selectively removed and the buffer layer 235 is etched in locations not covered by the etched absorber pattern to produce the mask features 247 in the final mask 225 (FIG. 2E). The absorber layer 230 and the buffer layer 235 may be etched using any suitable etching techniques. The etched mask pattern ultimately is used to pattern the semiconductor wafer using the projection optics and the condenser optics, as discussed above. In one implementation, as discussed above, the mask is etched using plasma etching.

Referring also to FIGS. 3A–3E, a fabricated mask 325 typically includes one or more defects 350, 352, 354, 356 that are formed during mask fabrication. In general, a defect is anything that changes the reflectivity of the fabricated mask 325. A defect may affect any part of the image formed on the semiconductor wafer by more than about 10%. For example, defects may be introduced into the mask blank by particle contamination or surface blemishes on the substrate, during deposition of the ML reflector, or from surface contamination of the mask blank.

Figure 3A:
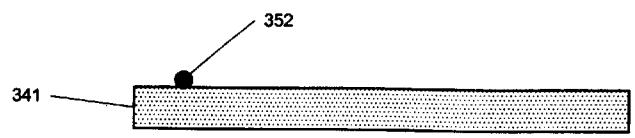
FIGS. 3A–3E are cross-sectional representations of a mask being fabricated using a second fabrication process.
Figure 3B:
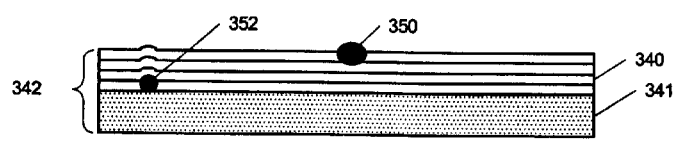
Figure 3C:
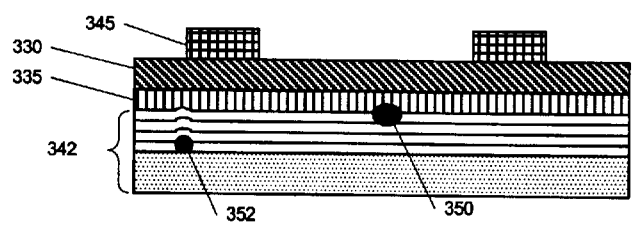
Figure 3D:
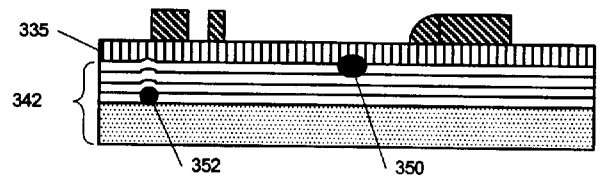
Figures 3E, 4:
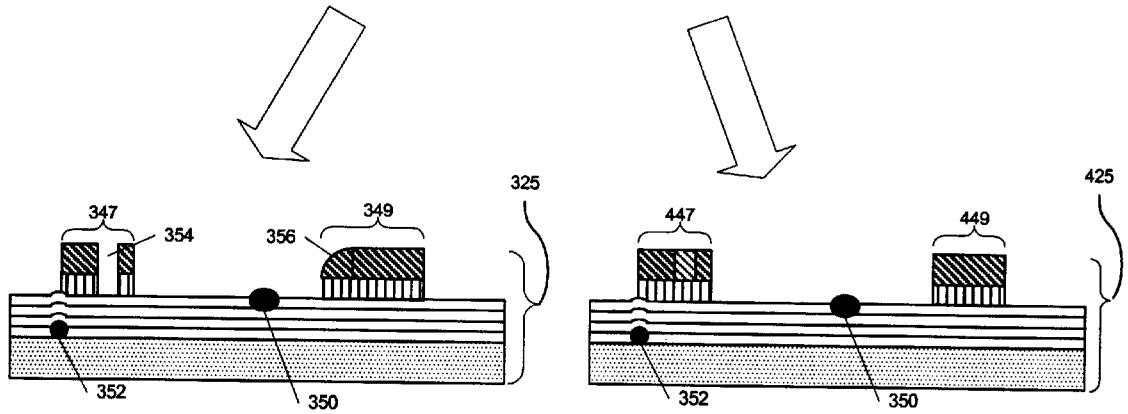
FIG. 4 is a cross-sectional representation of a mask being fabricated using a third fabrication process.

As shown, during fabrication of the mask 325, defects 350, 352 are formed in the ML reflector 340. The ML reflector 340 has been deposited on substrate 341 to form mask blank 342. Defect 352 may have been introduced into the mask blank 342 by surface blemish on the substrate 342 and defect 350 may have been introduced into the mask blank 342 during deposition of the ML reflector 340 or from surface contamination of the mask blank 342. A photoresist 345 is patterned on top of an absorber layer 330 and that pattern is replicated into the absorber layer 330 by etching to form an etched absorber pattern (FIGS. 3C and 3D). The photoresist 345 then is selectively removed and a buffer layer 335 is etched in locations not covered by the etched absorber pattern to produce the mask features 347, 349 in the mask 325 (FIG. 3E). As shown, defects 354, 356 are formed in features 347, 349, respectively during etching of the buffer layer 335 and absorber layer 330. Generally, defects in the mask features may or may not be caused by underlying defects in the mask blank.

Traditionally, EUVL mask fabrication requires that the mask blank be essentially defect free, that is, that the mask include less than 0.003 defects per square centimeter (cm) at a defect size greater than 30 nm. Such a requirement is not only difficult to achieve but also increases the cost of mask fabrication.

Figure 5:
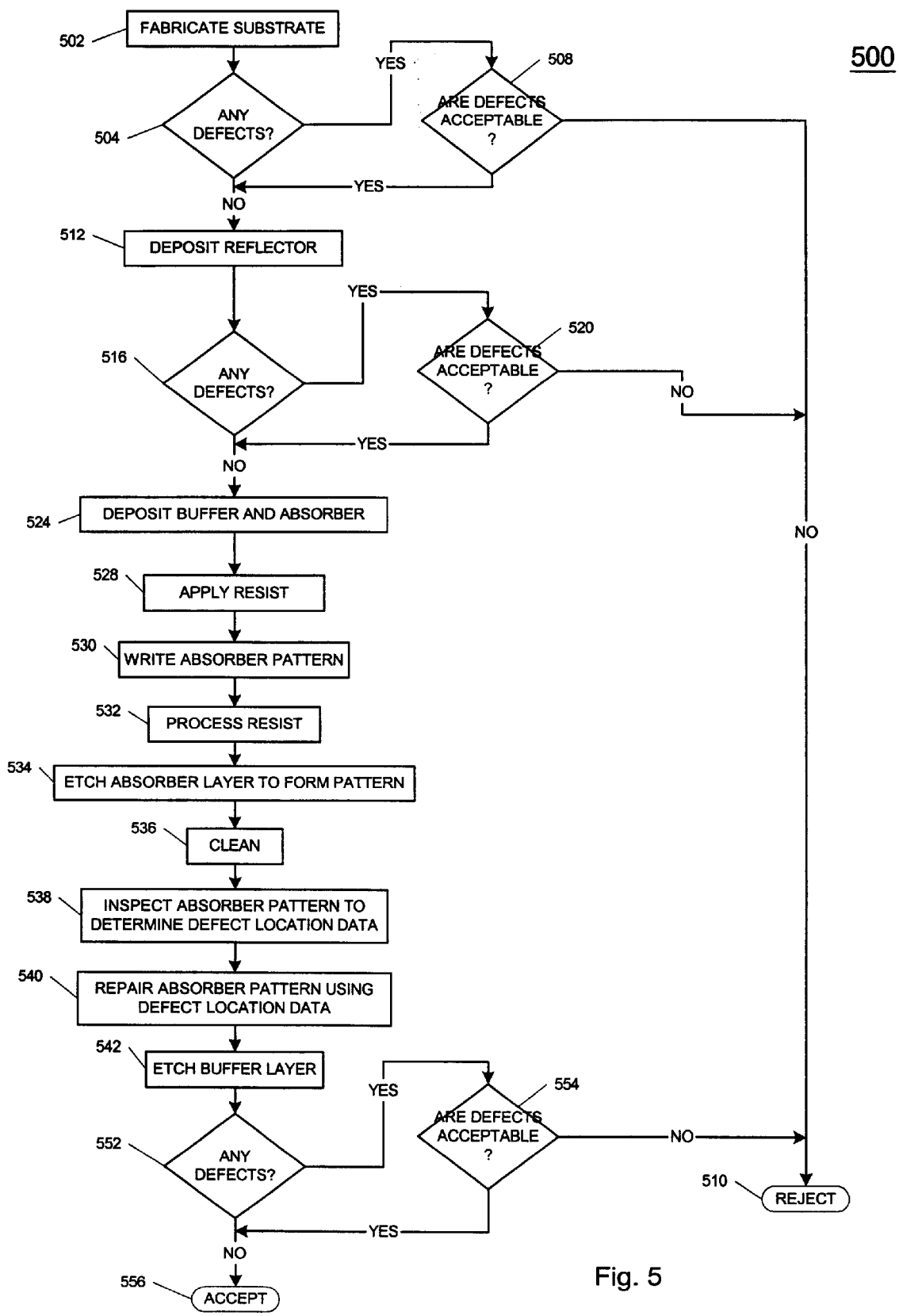
FIG. 5 is a flow chart of a procedure for fabricating the mask of FIG. 2.
Figure 6:
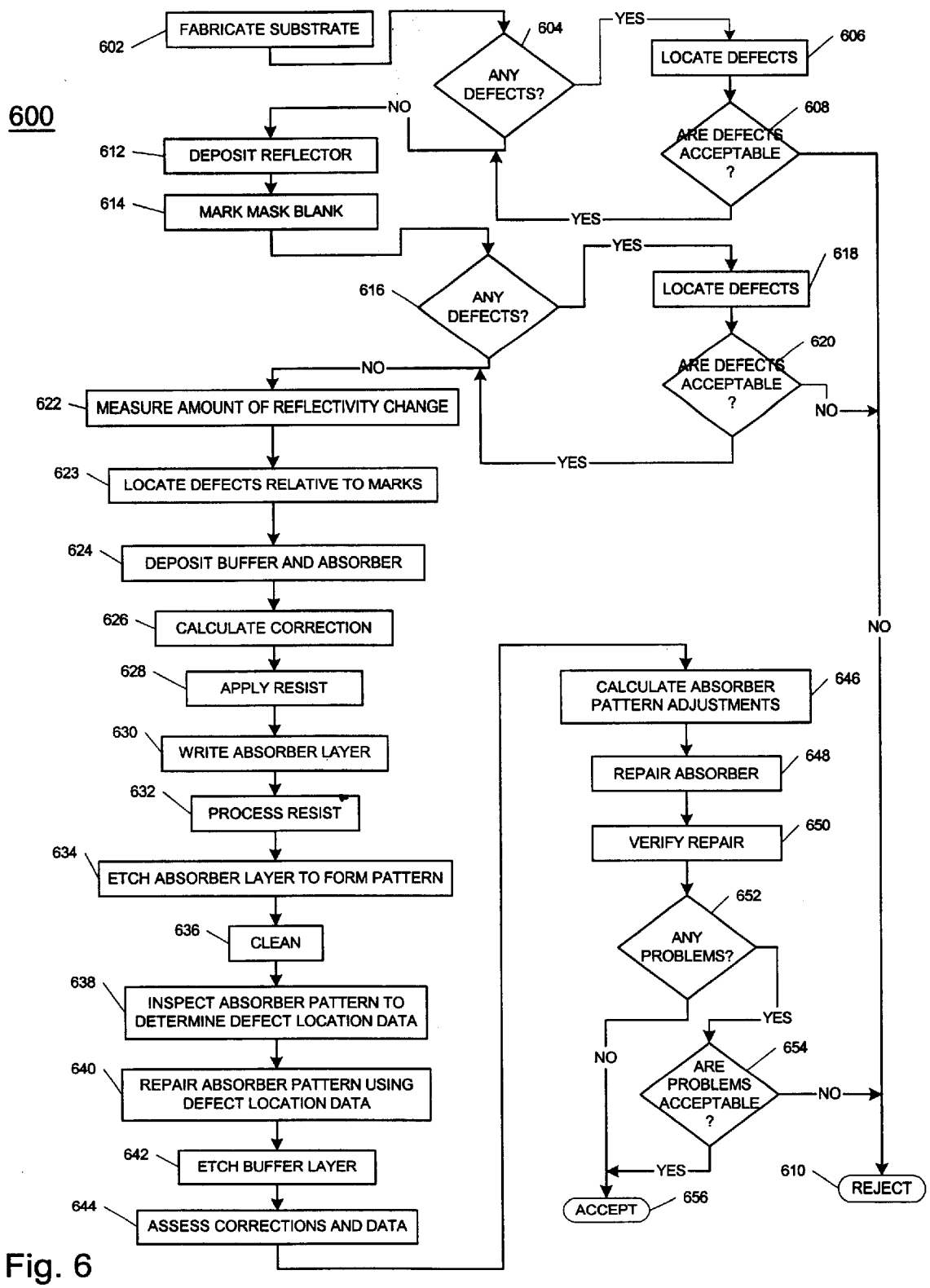
FIGS. 6 and 7 are flow charts of a procedure for fabricating a mask.

Referring also to FIGS. 4 and 5, a mask 425 may be fabricated using a procedure 500 that compensates for defects 354, 356 in the fabricated mask 425. Initially, the substrate 341 is fabricated as detailed with respect to FIG. 3A (step 502). The substrate 341 is inspected for surface defects that will be replicated in the ML reflector 340 (step 504). For example, defect 352 is a surface defect that is detected. The substrate 341 may be inspected using any inspection technique that can detect surface defects, such as, for example, optical inspection.

If the substrate defects are unacceptable (step 508), then the substrate is rejected (step 510). The level of unacceptability may be based on thresholds of densities of the defects, sizes of the defects, and/or positions of defects. For example, as discussed, a threshold density may be 0.003 defects per square cm and unacceptable defects may be those larger than 30 nm in any dimension.

If the substrate defects are acceptable (step 508), then the ML reflector 340 is deposited on the substrate 341 to form the mask blank 342 (step 512). The mask blank 342 is then inspected for defects formed in the ML reflector 340 (step 516). For example, defect 350 is a defect formed in the ML reflector 340. The mask blank 342 may be inspected using any suitable inspection technique such as, for example, optical inspection using reflected light or actinic inspection, which uses radiation at a wavelength used by the photolithography imaging system to image the semiconductor wafer. For example, if the fabricated mask 325 were to be used in the photolithography imaging system 100 (FIG. 1), the actinic wavelength would be the wavelength output from the radiation source 105. In general, the inspection technique may be any technique that either directly or indirectly emulates the photolithography imaging system used to image the semiconductor wafer.

If the mask blank defects are unacceptable (step 520), then the mask blank 342 is rejected (step 510). For example, as discussed, a threshold density may be 0.003 defects per square cm and unacceptable defects may be those larger than 30 nm in any dimension.

If the mask blank defects are acceptable (step 520), then the buffer and the absorber are deposited on the mask blank 342 using techniques previously discussed to form the buffer layer 335 and the absorber layer 330 (step 524). Next, the photoresist 345 is applied to the absorber layer 330 (step 528), patterned using stored pattern data (step 530), and then processed based on the patterning (step 532) as shown in FIG. 3C.

The pattern is replicated into the absorber layer 330 by etching the absorber layer 330 in locations not covered by the photoresist 345 (step 534) as shown in FIG. 3D. The photoresist 345 then is removed (step 536) as shown in FIG. 3D to reveal an etched absorber pattern.

The etched absorber pattern is then inspected for defects (step 538). Defects to the etched absorber pattern such as defects 354 and 356 should be visible during pattern inspection. The etched absorber pattern may be inspected using any suitable inspection technique such as, for example, conventional optical inspection using reflected light. Using this technique, a sensitivity of 45 nm may be achieved for a 45 nm technology node. This technique uses reflected light defect recognition algorithms and reflected light database rendering software.

Defect data from the inspection (step 538) is used to repair the etched absorber pattern (step 540). The etched absorber pattern may be repaired by, for example, adding absorber material to a feature in proximity of the defect. For example, absorber material is added to the etched absorber pattern at defect 354 to form a corrected feature 447. The etched absorber pattern also may be repaired by, for example, trimming a feature in proximity of the defect. For example the etched absorber pattern is trimmed at defect 356 to form a corrected feature 449. In both cases, the repair uses defect data such as the size and nature of the defect and computer simulation to determine how much material should be added or removed to correct for reflectivity loss. Because it has not yet been etched, the underlying buffer serves to protect the ML reflector 340 during repair of the etched absorber pattern. The etched absorber pattern may be repaired using any suitable technique, such as, for example, electron beam bombardment.

The buffer layer 335 is then etched in locations not covered by the etched absorber pattern to produce the mask 325 shown in FIG. 3E (step 542). Then, the fabricated mask 325 is inspected using any suitable inspection technique (step 552). A suitable inspection technique, whether optical or actinic, may include an actinic aerial image review. This detailed review may be any technique that either directly or indirectly emulates the photolithography imaging system used to expose the semiconductor wafer. If the defects are unacceptable (step 554), then the fabricated mask 325 is rejected (step 510). If the defects are acceptable (step 554), then the fabricated mask 325 is accepted (step 556).

A mask is acceptable if the defect does not have a substantial effect on the operation of the mask. A ML reflector defect (such as defect 352) may have a diameter of 25 nm and may form a bump in the surface of the ML reflector that is 65 nm wide and 1.5 nm high. Such a defect may cause a 20% change in a 25 nm feature.

Referring to FIGS. 6, 7, 8A, and 8D, a mask 825 may be fabricated using a procedure 600 that compensates for defects 850, 852, and 854 in a mask blank 842 formed from a ML reflector 840 deposited on a substrate 841. The procedure 600 further compensates for defects in an etched absorber pattern as is detailed with respect to FIG. 4. Initially, the substrate 841 is fabricated (step 602) and inspected for surface defects that will be replicated in the ML reflector 840 (step 604). The locations of the defects are detected and that information is stored for future analysis (step 606). As discussed, the substrate 841 may be inspected using any inspection technique.

If the substrate defects are unacceptable (step 608), then the substrate is rejected (step 610). As discussed, the level of unacceptability may be based on thresholds of densities of the defects, sizes of the defects, and/or positions of the defects. If the substrate defects are acceptable (step 608), then the ML reflector 840 is deposited on the substrate 841 to form the mask blank 842 (step 612).

Additionally, fiducial or reference marks are formed into the mask blank 842 (step 614). These reference marks will be used later in the procedure 600 to define a location on the mask blank 842. The reference marks may be fabricated using any suitable method. Suitable methods include, for example, focused ion beam sputtering or gas-assisted etching, electron beam induced gas-assisted etching, or use of a nanoindenter. The reference marks may be formed of any suitable density. In one implementation, at least two reference marks are formed into the mask blank 842. In another implementation, the reference marks are formed so that a location may be determined on the marked mask blank 842 to better than 100 nm resolution.

The mask blank 842 is then inspected for defects formed in the ML reflector 840 (step 616). The locations of the mask blank defects are detected and that information is stored for future analysis (step 618). As discussed, the mask blank 842 may be inspected using any suitable inspection technique. A suitable inspection technique, whether optical or actinic, may include an actinic aerial image review. This detailed review may be any technique that either directly or indirectly emulates the photolithography imaging system used to expose the semiconductor wafer.

If the mask blank defects are unacceptable (step 620), then the mask blank 842 is rejected (step 610). If the mask blank defects are acceptable (step 620), then a reflectivity change of the mask blank 842 is measured based on the detected and located defects (step 622). Additionally, at this point, the defects detected in the ML reflector 840 may be more precisely located relative to the reference marks that were formed into the mask blank 842 (step 623). The defect location information may then be stored for later use in the procedure 600.

A buffer and an absorber are deposited on the mask blank 842 using techniques previously discussed to form a buffer layer and an absorber layer, respectively (step 624). A correction is calculated in an absorber pattern that would be formed from the mask blank 842 (step 626). The correction reduces the effect that the located defects would have on the operation of the mask fabricated from the mask blank 842.

Figure 7:
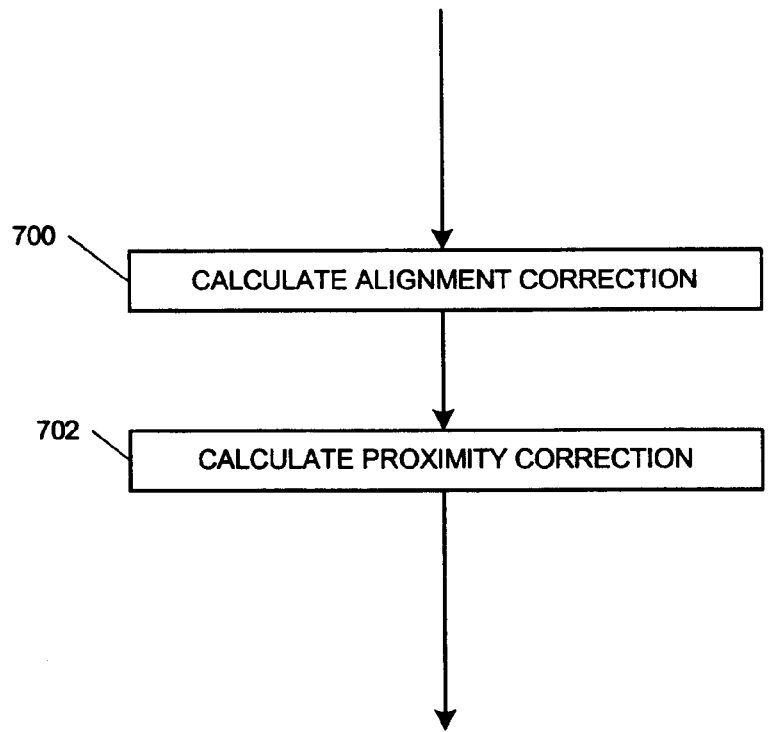

Referring also to FIG. 7, calculating the correction in the absorber pattern includes calculating a correction in a placement or alignment of an etched absorber pattern relative to the detected defects (step 700) and calculating a correction in a size of the etched absorber pattern (step 702). The correction in the alignment (step 700) increases defect acceptability (or reduces defect "printability") by placing mask blank defects under features of the mask 825 or by moving the mask blank defects away from the edge of the features of the mask 825. The correction in the size (step 702) compensates for the change in reflectance of the ML reflector 840 due to the mask blank defect.

The information from the corrections calculated in steps 700 and 702 is used to mitigate the effects of defects in the fabricated mask. In this way, the effects of the mask blank defects will have a reduced impact on the operation of the mask, and a greater number of masks will be acceptable during fabrication.

Figure 8A:
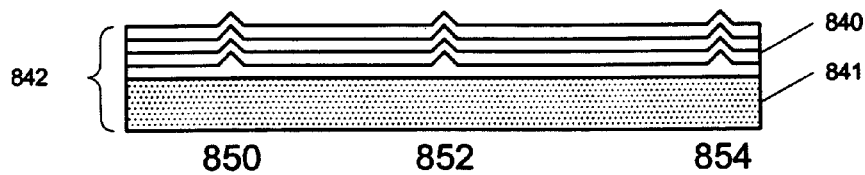
FIGS. 8A–8D are cross-sectional representations of a mask being fabricated using the procedure of FIGS. 6 and 7.
Figure 8B:
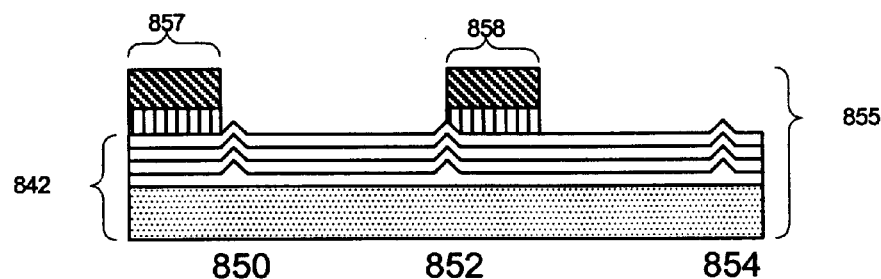

For example, FIG. 8B shows a mask 855 having an etched absorber pattern with features 857 and 858 formed without the information from the corrections calculated in steps 700 and 702. In mask 855, defects 850 and 852 would be unacceptable because of their proximity to features 857 and 858 and defect 854 may be acceptable depending on its proximity to feature 858.

Figure 8C:
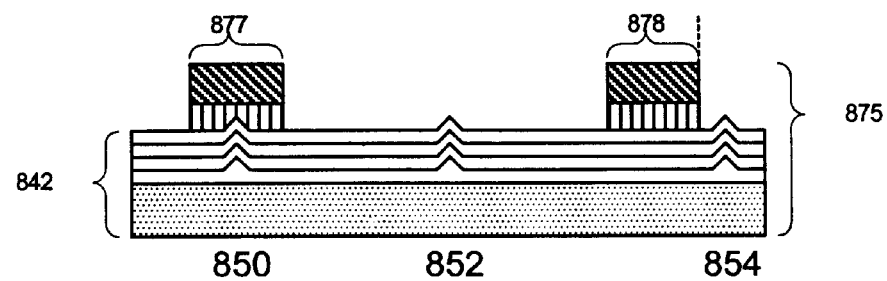

As another example, FIG. 8C shows a mask 875 having an etched absorber pattern with features 877 and 878 formed with the information from the correction calculated in step 700 but without the information from the correction calculated in step 702. In mask 875, defect 850 would be acceptable because of its placement under feature 877, defect 852 may be acceptable depending on its distance from features 877 and 878, and defect 854 would be unacceptable because of its proximity to features 877 and 878.

Figure 8D:
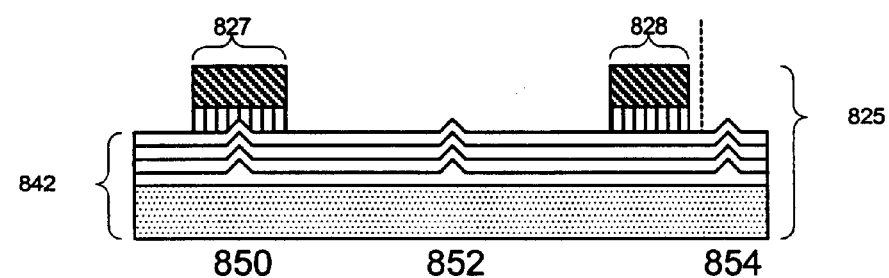

By contrast, FIG. 8D shows the mask 825 with features 827 and 828 formed with information from the corrections calculated in steps 700 and 702. In mask 825, defect 850 would be acceptable because of its placement under feature 827, defect 852 would be acceptable or able to be corrected because of its distance from features 827 and 828, and defect 842 would be acceptable because it has been corrected to compensate for the change in reflectance of the ML reflector 840.

After the correction in the absorber pattern is calculated (step 626), a photoresist is applied to the absorber layer (step 628), patterned using stored pattern data and the calculated correction (step 630), and then processed based on the patterning (step 632). The pattern is replicated into the absorber layer by etching the absorber layer in locations not covered by the photoresist (step 634). The photoresist then is removed (step 636) to reveal an etched absorber pattern.

The etched absorber pattern is then inspected for defects (step 638). The etched absorber pattern may be inspected using any suitable inspection technique such as, for example, conventional optical inspection using reflected light.

Defect data from the inspection (step 638) is used to repair the etched absorber pattern (step 640). For example, as detailed above with respect to FIG. 4, absorber material may be added to a portion of the etched absorber pattern to form a corrected feature in the mask 825 or absorber material trimmed from a portion of the etched absorber pattern in proximity of the defect to form a corrected feature in the mask 825. The repair uses defect data such as the size and nature of the defect and computer simulation to determine how much material should be added or removed to correct for reflectivity loss. Because it has not yet been etched, the underlying buffer layer serves to protect the ML reflector 840 during repair of the etched absorber pattern. The etched absorber pattern may be repaired using any suitable technique, such as, for example, electron beam bombardment.

The buffer layer is then etched in locations not covered by the absorber layer to produce the mask 825 having features 827 and 828, as shown in FIG. 8D (step 642).

Then, the fabricated mask 825 is reviewed, that is inspected and assessed, using any suitable inspection technique (step 644). In general, this review may include a technique that either directly or indirectly emulates the photolithography imaging system used to image the semiconductor wafer such as actinic aerial image review. Inspection of the mask 825 (step 644) may include comparing results from the inspection with the calculated correction or simply analyzing the calculated correction that was determined at step 626.

Next, adjustments in the etched absorber pattern are calculated to correct for any remaining discrepancies or problems determined by the inspection in step 644 (step 646). The etched absorber pattern is then repaired based on the calculated adjustments (step 648) and the repair is verified (step 650).

The mask is inspected again to detect any remaining problems (step 652). If the problems are unacceptable (step 654), then the fabricated mask is rejected (step 610). If the problems are acceptable (step 654) or if there are no remaining problems (step 652), then the fabricated mask is accepted (step 656).

Figure 9A:
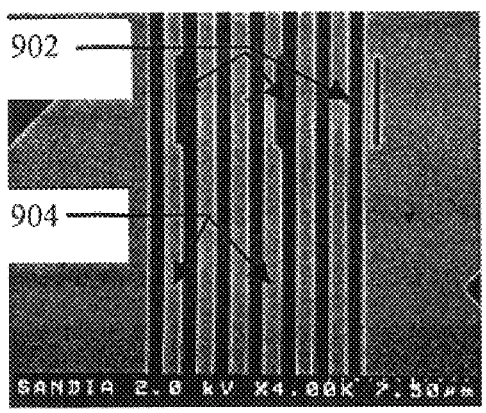

In FIG. 9A, a portion of a mask is shown having defects 902 in the etched absorber pattern and defects 904 (not visible) that have been printed into the substrate at a known location and size. In this image, the absorber material is dark and the ML reflector is bright.

Figure 9B:
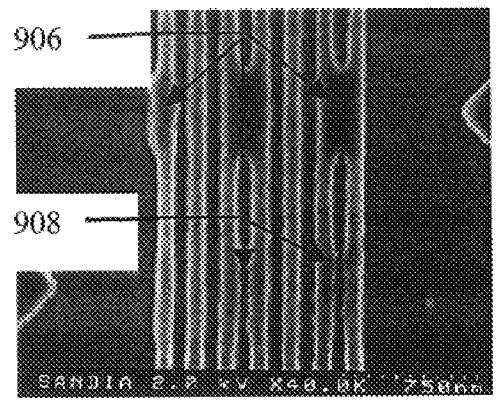

In FIG. 9B, an inverted printed image of the mask portion of FIG. 9A is shown. The printed image was produced using a 10× EUV microstepper from Sandia National Laboratories. The absorber defects 902 have not been repaired and show up in the printed image as absorber defects 906. The substrate defects 904 have not been repaired and show up in the printed image as substrate defects 908.

In FIG. 9C, a portion of the mask of FIG. 9A is shown in which the substrate defects 904 have been repaired as shown by the portions 910 at which the absorber has been removed in the proximity of the substrate defects 904. The substrate defects 904 are repaired in this mask using a focused ion beam technique. The absorber defects 902 have not been repaired. In FIG. 9D, an inverted printed image of the mask portion of FIG. 9C is shown. Again, the printed image was produced using a 10× EUV microstepper from Sandia National Laboratories. Because the absorber defects 902 have not been repaired, they show up in the printed image as absorber defects 906. By contrast, because the substrate defects 904 have been repaired, the regions 912 near the repaired substrate defects 904 do not exhibit the defects 908 that were present in FIG. 9B.

Other implementations are within the scope of the following claims. For example, as discussed, the photolithography imaging system may use a transmissive mask. In this case, the mask includes a patterned absorber on a substrate that absorbs radiation at the wavelength at which the mask is patterned. The transmissive mask may include an imaging layer or a buffer layer on the substrate so that the absorber layer is not deposited directly on the substrate. During imaging, the image is projected onto the wafer.

In any case, the mask may be made with or without a buffer layer.

What is claimed is:

1. A method of making a photolithographic mask, the method comprising:

detecting a defect in a mask blank formed from a reflector on a substrate;

calculating a correction of an absorber pattern to be used in forming an absorber, the correction reducing effects of the mask blank defect on the operation of the mask; and forming an absorber on the mask blank using the absorber pattern and the calculated absorber pattern correction.

2. The method of claim 1 in which detecting a defect in the mask blank comprises locating a position of the defect.

3. The method of claim 1 in which detecting a defect in the mask blank comprises measuring a size of the defect.

4. The method of claim 1 in which calculating a correction of the absorber pattern comprises calculating a change in reflectance of the mask blank at the defect.

5. The method of claim 1 further comprising forming reference marks on the mask blank, in which calculating a correction in the absorber pattern comprises calculating a location of the detected defect with respect to the reference marks.

6. The method of claim 1 in which calculating a correction of the absorber pattern comprises calculating a change in a placement of the absorber pattern relative to the detected mask blank defect that will reduce the effects of the mask blank defect.

7. The method of claim 6 in which forming the absorber comprises using the calculated correction in the absorber pattern placement.

8. The method of claim 1 in which calculating a correction in the absorber pattern comprises calculating a change in a size of at least a portion of the absorber pattern.

9. The method of claim 8 in which forming the absorber comprises using the absorber pattern with the size of at least the portion of the absorber pattern changed.

10. The method of claim 1 in which forming the absorber comprises:

forming an absorber layer, writing the absorber pattern corrected according to the calculated absorber pattern correction on the absorber layer, and etching the absorber layer to form an etched absorber pattern based on the written absorber pattern.

11. The method of claim 10 further comprising inspecting the etched absorber pattern.

12. The method of claim 11 further comprising repairing the etched absorber pattern based on the inspecting.

13. The method of claim 11 further comprising comparing results from the inspecting with the calculated correction in the absorber pattern.

14. The method of claim 13 further comprising calculating an adjustment in the etched absorber pattern based on the comparing.

15. The method of claim 13 further comprising repairing the etched absorber pattern based on the comparing.

16. The method of claim 1 in which detecting a defect in the mask blank comprises inspecting the reflector using radiation reflected by the reflector.

17. The method of claim 1 in which detecting a defect in the mask blank comprises inspecting the reflector using radiation having a wavelength at which the mask will be imaged during photolithography.

18. The method of claim 1 further comprising detecting a defect in the substrate, in which calculating a correction of the absorber pattern comprises calculating a correction that reduces the effect that the substrate defect has on the operation of the mask.

19. The method of claim 1 in which detecting a defect in the mask blank comprises detecting a defect in the substrate.

20. The method of claim 1 in which detecting a defect in the mask blank comprises detecting a defect in the reflector.

21. A method of making a photolithographic mask, the method comprising:

detecting a defect in a substrate;

calculating a correction of an absorber pattern to be used in forming an absorber, the correction reducing effects of the substrate defect on the operation of the mask;

forming an absorber layer on a mask blank made of a reflector on a substrate; and applying the absorber pattern to the absorber layer using the calculated absorber pattern correction.

22. The method of claim 21 further comprising etching the absorber layer to form an etched absorber pattern based on the applied absorber pattern.

23. The method of claim 22 further comprising inspecting the etched absorber pattern.

24. The method of claim 23 further comprising repairing the etched absorber pattern based on the inspecting.

25. The method of claim 23 further comprising comparing results from the inspecting with the calculated correction in the absorber pattern.

26. The method of claim 25 further comprising calculating an adjustment in the etched absorber pattern based on the comparing.

27. The method of claim 25 further comprising repairing the etched absorber pattern based on the comparing.

28. A method of making a photolithographic mask, the method comprising:

forming an absorber layer on a mask blank having a reflector on a substrate;

etching the absorber layer to form an etched absorber pattern;

detecting a reflectance abnormality in the etched absorber pattern; and calculating a correction in the etched absorber pattern that reduces the reflectance abnormality in the etched absorber pattern.

29. The method of claim 28 further comprising repairing the etched absorber pattern using the calculated correction.

* * * * *